(12) United States Patent
Isomura et al.

(10) Patent No.: US 11,276,790 B2
(45) Date of Patent: Mar. 15, 2022

(54) SEMICONDUCTOR LIGHT RECEIVING ELEMENT

(71) Applicant: KYOTO SEMICONDUCTOR CO., LTD., Kyoto (JP)

(72) Inventors: Takatomo Isomura, Kyoto (JP); Etsuji Omura, Kyoto (JP)

(73) Assignee: KYOTO SEMICONDUCTOR CO., LTD., Kyoto (JP)

( * ) Notice: Subject to any disclaimer, the term of this patent is extended or adjusted under 35 U.S.C. 154(b) by 0 days.

(21) Appl. No.: 16/959,624

(22) PCT Filed: Feb. 1, 2018

(86) PCT No.: PCT/JP2018/003454
§ 371 (c)(1),
(2) Date: Jul. 1, 2020

(87) PCT Pub. No.: WO2019/150535
PCT Pub. Date: Aug. 8, 2019

(65) Prior Publication Data
US 2021/0193850 A1 Jun. 24, 2021

(51) Int. Cl.
*H01L 31/0232* (2014.01)
*H01L 31/103* (2006.01)
*H01L 31/167* (2006.01)

(52) U.S. Cl.
CPC .... *H01L 31/02327* (2013.01); *H01L 31/1035* (2013.01); *H01L 31/167* (2013.01)

(58) Field of Classification Search
CPC ............. H01L 31/02327; H01L 31/167; H01L 31/1035
See application file for complete search history.

(56) References Cited

U.S. PATENT DOCUMENTS 5,672,519 A * 9/1997 Song ................... H01L 27/1462
438/69
5,684,308 A 11/1997 Lovejoy et al.
5,895,943 A * 4/1999 Park .................. H01L 27/14868
257/232

(Continued)

FOREIGN PATENT DOCUMENTS

JP 4-233759 A 8/1992
JP 5-167055 A 7/1993

(Continued)

*Primary Examiner* — Sitaramarao S Yechuri
(74) *Attorney, Agent, or Firm* — Norris McLaughlin, P.A.

(57) ABSTRACT

A semiconductor light receiving element of back-illuminated type comprises a light absorbing portion formed in the vicinity of the main surface of the semiconductor substrate transparent to the incident light, and a first convex lens portion larger than the light absorbing portion and having a radius of curvature R1 formed on a back surface of the semiconductor substrate, a second convex lens portion smaller than the light absorbing portion and having a radius of curvature R2 smaller than the radius of curvature R1; the second convex lens portion formed on the first convex lens portion and having a focal point between the second convex lens portion and the light absorbing portion; light incident on the second convex lens portion is diffused from the focal point toward the light absorbing portion.

4 Claims, 9 Drawing Sheets

(56) References Cited

U.S. PATENT DOCUMENTS

| | | | | |
|---|---|---|---|---|
| 6,001,540 A | * | 12/1999 | Huang | G02B 3/0012 |
| | | | | 216/2 |
| 2005/0041296 A1 | * | 2/2005 | Hsiao | H01L 27/14621 |
| | | | | 359/619 |
| 2005/0242271 A1 | * | 11/2005 | Weng | H01L 27/14685 |
| | | | | 250/214.1 |
| 2008/0157154 A1 | * | 7/2008 | Kim | H01L 27/14621 |
| | | | | 257/294 |
| 2014/0133871 A1 | | 5/2014 | Iemura et al. | |
| 2014/0167107 A1 | | 6/2014 | Yoneda et al. | |
| 2015/0136957 A1 | | 5/2015 | Iemura et al. | |
| 2018/0182789 A1 | * | 6/2018 | Inoue | H01L 31/02027 |

FOREIGN PATENT DOCUMENTS

| | | |
|---|---|---|
| JP | 10-117012 A | 5/1998 |
| JP | 2989996 B2 | 12/1999 |
| JP | 30301238 B2 | 4/2000 |
| JP | 2007-19308 A | 1/2007 |
| JP | 2011-124450 A | 6/2011 |
| JP | 2014-93459 A | 5/2014 |
| JP | 2014-112650 A | 6/2014 |
| JP | 2015-96878 A | 5/2015 |
| JP | 2016-143707 A | 8/2016 |

\* cited by examiner

SEMICONDUCTOR LIGHT RECEIVING ELEMENT

TECHNICAL FIELD

The present invention relates to a semiconductor light receiving element that converts received incident light into an electric signal and outputs the electric signal, and more particularly to a semiconductor light receiving element that can improve a response speed.

BACKGROUND ART

In the optical communication field, developments are being made to increase the transmission speed in order to respond to a rapid increase in the traffic. In optical communication, an optical signal is transmitted from a transmitting side via an optical fiber cable, and an optical signal received by a semiconductor light receiving element is converted into an electric signal on a receiving side.

The transmission speed on the receiving side can be increased by increasing the response speed of the semiconductor light receiving element. For this purpose, it is necessary to improve the upper limit of the response speed defined by the element capacitance and the element resistance. The element capacitance becomes smaller as the area of the light receiving part of the semiconductor light receiving element, that is, the diameter of the light absorbing portion for converting light into electricity (charge) becomes smaller. For example, when a semiconductor light receiving element having a response frequency band of about 20 GHz is realized, if the diameter of the light absorbing portion is about 20 μm, the element capacity becomes sufficiently small.

On the other hand, the semiconductor light receiving element receives incident light emitted from the end of the optical fiber cable and traveling while spreading at a predetermined divergence angle (divergence angle). Therefore, as the diameter of the light absorbing portion is reduced in order to reduce the element capacity, the amount of received light is reduced and the receiving efficiency (sensitivity) is reduced. For this reason, there is known a back-illuminated type semiconductor light receiving element in which a convex lens capable of condensing incident light on a small diameter of light absorbing portion is formed on a semiconductor substrate in order to suppress a decrease in the amount of received light, as in Patent Documents #1 and #2.

PRIOR ART DOCUMENTS

Patent Documents

Patent Document #1: Japanese Patent Publication 2989996.

Patent Document #2: Japanese Patent Publication 3031238.

SUMMARY OF THE INVENTION

Technical Problem

However, when the convex lens portion focuses the incident light on the light absorbing portion, charges are intensively generated near the focal point, and the movement of the charges is restricted by excessive concentration of the charges, thereby response speed is hindered. In the case of incident light having a small divergence angle, even if the convex lens portion does not focus on the light absorbing portion, the charge generated by the incident light concentrated on a part of the light absorbing portion due to the condensing action of the convex lens portion is excessively concentrated, and the increase in response speed may be hindered by the space charge effect.

Even if the incident light has a large divergence angle, it is a Gaussian beam that can be regarded as a Gaussian distribution in which the intensity distribution of the incident light in radial direction in a plane perpendicular to the optical axis become stronger toward the optical axis of the incident light. Therefore, the generation of charges is excessively concentrated at a part of the light absorbing portion where the intensity of the incident light is high due to the light condensing action of the convex lens portion, and the increase in response speed may be hindered by the space charge effect.

An object of the present invention is to provide a semiconductor light receiving element capable of increasing the response speed.

Means to Solve the Problems

The present invention presents a light receiving element of back illuminated type comprising a light absorbing portion provided in a vicinity of a main surface of a semiconductor substrate transparent to a incident light, and a first convex lens portion having a larger diameter than the light absorbing portion and having a radius of curvature R1 provided on a back surface of the semiconductor substrate opposite to the main surface, in which a center of the light absorbing portion is located on an optical axis of the first convex lens portion; wherein, in a central portion of the first convex lens portion, provided is a second convex lens portion having a common optical axis to the first convex lens portion, a smaller diameter than the light absorbing portion, and a curvature radius R2 smaller than the curvature radius R1, and the second convex lens portion has a focal point between the second convex lens portion and the light absorbing portion, thereby diffusing light incident on the second convex lens portion from the focal point toward the light absorbing portion.

According to the above configuration, of the incident light incident along the optical axis of the first convex lens portion, the light incident on the first convex lens portion can be collected toward the light absorbing portion, and the light incident on the second convex lens portion can be diffused toward the light absorbing portion. Therefore, it is possible to secure the amount of light received in the light absorbing portion and avoid the space charge effect due to the concentration of the incident light in the light absorbing portion, thereby realizing a high response speed of the semiconductor light receiving element.

In preferable first aspect of the present invention, based on a distance L from an emission point of the incident light to the second convex lens portion, a divergence angle θ of the incident light, a diameter D of the light absorbing portion, and a distance H between the second convex lens portion and the light absorbing portion, the radius of curvature R2 of the second convex lens portion is set such that all of the incident light incident on the second convex lens portion is incident on the light absorbing portion.

According to the above configuration, all of the light in the central portion where the light intensity of the incident light is strong is made to enter the light absorbing portion surely so as to diffuse. Therefore, it is possible to secure the amount of light received in the light absorbing portion, and to realize a high response speed of the semiconductor light receiving element by avoiding the space charge effect.

In a preferable second aspect of the present invention, when a refractive index of the semiconductor substrate with respect to air is n, then the radius of curvature R1 of the first convex lens portion satisfies a relation of $(n-1)/(1/L+n/H) < R1 < (n-1)/(n/H)$.

According to the above configuration, the light can be collected by the first convex lens portion without focusing on the light absorbing portion. Therefore, the light receiving amount of the light absorbing portion is ensured, the spam charge effect is avoided, and the response speed of the semiconductor light receiving element is increased.

In a preferable third aspect of the present invention, the semiconductor substrate is made of an InP substrate.

According to the above configuration, since infrared light having a wavelength used in optical communication can be efficiently received, the response speed of the semiconductor light receiving element for optical communication can be increased.

Advantages of the Invention

According to the semiconductor light receiving element of the present invention, the response speed can be increased.

DESCRIPTION OF EMBODIMENT

Best mode for implementing the present invention will now be explained on the basis of embodiment.

Figure 1:
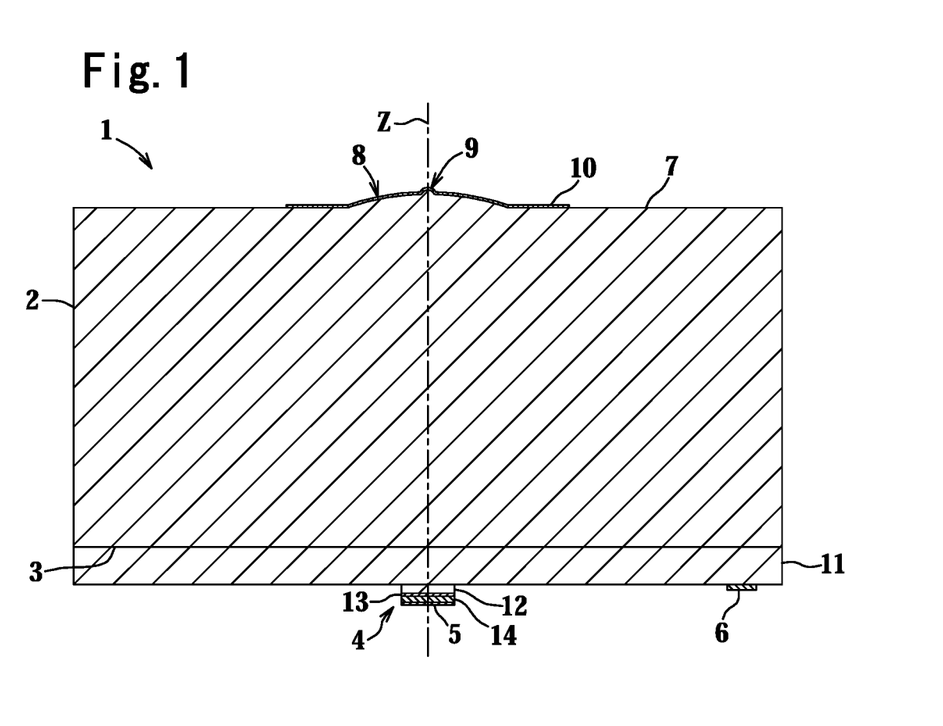
FIG. 1 is a sectional view of a semiconductor light receiving element according to an embodiment of the present invention.

First, the overall configuration of the semiconductor light receiving element 1 will be described based on FIG. 1.

The semiconductor light receiving element 1 includes a semiconductor substrate 2 that is transparent to incident light, a light receiving part 4 disposed near a main surface 3 of the semiconductor substrate 2, a p-electrode 5 on the light receiving part 4, an n-electrode 6 provided on the main surface 3 side. On the back surface 7 of the semiconductor substrate 2 opposite to the main surface 3 of the semiconductor substrate 2, a first convex lens portion 8 and a second convex lens portion 9 having a smaller diameter than the first convex lens portion 8 which is provided at the center of the first convex lens portion 8 and an antireflection film 10 covering at least the first and second convex lens portions 8 and 9. The semiconductor light receiving element 1 of back illuminated type is configured to introduce light incident on the first and second convex lens portions 8 and 9 from the back surface 7 side of the semiconductor substrate 2 to the light receiving part 4 and convert the light into electric charges. As the semiconductor substrate 2 made of an n-InP substrate used for a light receiving element for receiving infrared light having a wavelength of 1.3 μm or 1.5 μm for optical communication will be described as an example. But, another semiconductor material can be applied according to purpose.

The main surface 3 of the semiconductor substrate 2 is covered with a buffer layer 11 made of, for example, an n-type InP layer. The light receiving part 4 is constituted with a PIN photodiode which includes a first semiconductor layer 12 made of, for example, an n-type InP layer, a light absorbing portion 13 made of an InGaAs layer, and a second semiconductor layer 14 made of a p-type InP layer and these layers are stacked on opposite side to the semiconductor substrate 2 with respect to the buffer layer 11, sequentially from the buffer layer 11.

The thicknesses of the buffer layer 11, the first semiconductor layer 12, the light absorbing portion 13, and the second semiconductor layer 14 are, for example, 5 μm, 2 μm, 1 μm, and 2 μm in this order. When a response frequency band of about 20 GHz is required, a columnar or truncated conical light receiving part 4 having the light absorbing portion 13 of a diameter D of about 20 μm is formed. In order to increase the response speed, the first and second semiconductor layers 12 and 14 preferably have a dopant concentration of $1 \times 10^{18}$ cm$^{-3}$ or more and have a low resistance.

The p-electrode 5 is provided so as to be conductive to the second semiconductor layer 14, and the n-electrode 6 is provided so as to be conductive to the buffer layer 11. A region other than the p-electrode 5 and the n-electrode 6 on the main surface 3 side of the semiconductor substrate 2 may be covered with a protective film (for example, a silicon nitride film having a thickness of about 100 nm). The current due to the charge generated by the incident light in the light receiving part 4 is output to the outside via the p-electrode 5 and the n-electrode 6.

The first convex lens portion 8 on the back surface 7 of the semiconductor substrate 2 is formed in a partially spherical shape having a diameter larger than the light absorbing portion 13, for example, a diameter (width) of 60 μm and a radius of curvature R1 of 100 μm. The first convex lens portion 8 is disposed so that the optical axis Z thereof passes through the center of light absorbing portion 13. At the center of the first convex lens portion 8, a second convex lens portion 9 having a common optical axis Z with the first convex lens portion 8 and having a partial spherical shape of a radius of curvature R2 smaller than the radius of curvature R1 is provided. The second convex lens portion 9 has, for example, a radius of curvature R2 of 20 μm, a diameter (width) of 5 μm, a smaller diameter than the light absorbing portion 13, and a distance H of 150 μm from the light absorbing portion 13. An antireflection film 10 made of, for example, a silicon nitride film having a thickness of 100 nm is provided on the back surface 7 of the semiconductor substrate 2 so as to cover at least the first and second convex lens portions 8 and 9. In FIG. 1, the convex shape is exaggerated so that the second convex lens portion 9 is easy to see.

Figure 2:
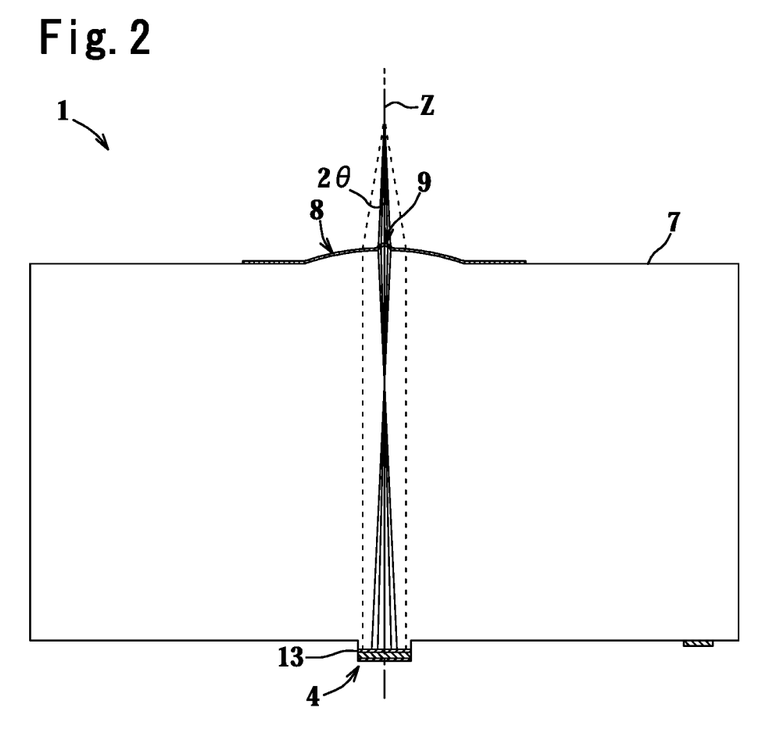
FIG. 2 is a schematic diagram showing an example of incident light incident on the semiconductor light receiving element of FIG. 1.

As shown in FIG. 2, incident light incident from the back surface 7 side of the semiconductor light receiving element 1 along the optical axis Z is refracted by the first and second convex lens portions 8 and 9 and reaches the light absorbing portion 13. For example, when incident light with a divergence angle 20 (full angle) of 5° is emitted from a position 50 μm away from the top (apex) of the second convex lens portion 9 on the optical axis Z, substantially all of the incident light enters in the second convex lens portion 9, is focused on the position between the second convex lens portion 9 and the light absorbing portion 13. Then, the incident light travels so as to diffuse from the focal point and reaches the light absorbing portion 13. Further, as shown by the broken line, when the divergence angle 20 of the incident light emitted from the same emission position is larger than 5°, the central portion of the incident light near the optical axis Z enters the second convex lens portion 9 and reaches the light absorbing portion 13 with diffusing. Then, incident light outside of the central portion enters the first convex lens portion 8 and can reach the light absorbing portion 13 by the light condensing action of the first convex lens portion 8.

Figure 3:
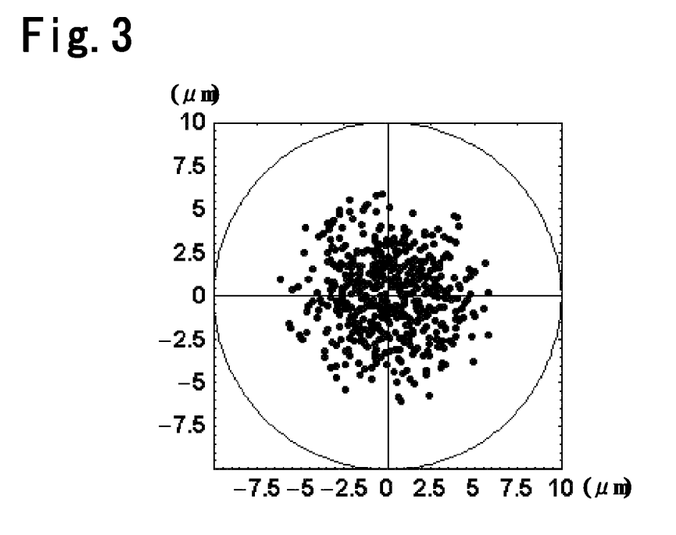
FIG. 3 is a diagram showing a simulation result of a arrival position in a light absorbing portion when incident light having a divergence angle of 5° is incident on the semiconductor light receiving element of FIG. 1.
Figure 4:
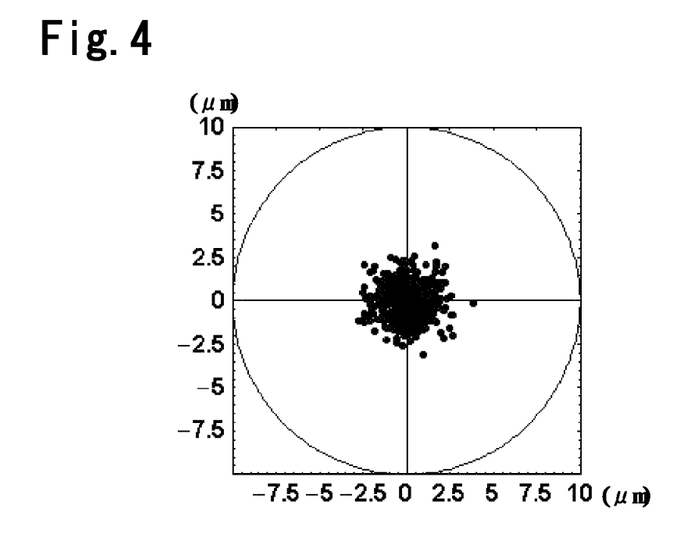
FIG. 4 is a diagram showing a simulation result of an arrival position in a light absorbing portion when incident light having a divergence angle of 5° is incident on a semiconductor light receiving element having a conventional convex lens portion.

FIG. 3 shows the results of a simulation of the arrival position in the light absorbing portion of the incident light having a divergence angle 20 of 5° from the emission position in FIG. 2. FIG. 4 shows a simulation result of the arrival position of the same incident light at the light absorbing portion 13 of the conventional semiconductor light receiving element equivalent to the semiconductor light receiving element 1 except that the second convex lens portion 9 is not provided. The circle in the figures represents the light absorbing portion 13, and the points represent the arrival positions of the 500 light beams included in the randomly extracted incident light in the light absorbing portion 13. In FIG. 4 without the second convex lens portion 9, the light is focused at the center of the light absorbing portion 13, but in FIG. 3, the arrival position is not concentrated at the center of the light absorbing portion 13 by the second convex lens portion 9, and it can be seen that the incident light has reached a wide range.

Figure 5:
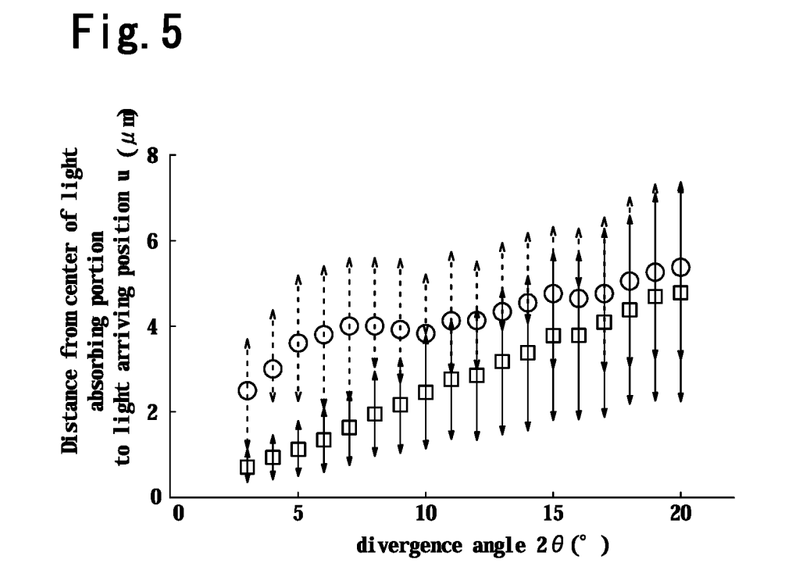
FIG. 5 is a diagram showing the relationship between the divergence angle of incident light and the average value and standard deviation of the distance from the center of the light absorbing portion at the incident position in the light absorbing portion.

FIG. 5 shows the relationship between the divergence angle 20 of the incident light incident on the semiconductor light receiving element 1 and the average value and the standard deviation of the distance u from the center of the light absorbing portion 13 at the position where the incident light arrives. The square (□) in the figure represents the average value when there is no second convex lens portion 9 corresponding to the conventional semiconductor light receiving device, and the circle (○) represents the average value of the semiconductor light receiving device 1 having the second convex lens portion 9. Arrows extending above and below these average values represent the respective standard deviations. When the second convex lens portion 9 is not provided, as the divergence angle 20 is smaller, the average value of the distance u and the standard deviation representing the variation are smaller. On the other hand, in the semiconductor light receiving element 1 having the second convex lens portion 9, the smaller the divergence angle 20, the larger the average value of the distance u tends to be than in the case without the second convex lens portion 9, and the standard deviation does not decrease to cause large variation. Therefore, it is understood that the incident light is diffused by the second convex lens unit 9 and reaches the light absorbing portion 13.

Figure 6:
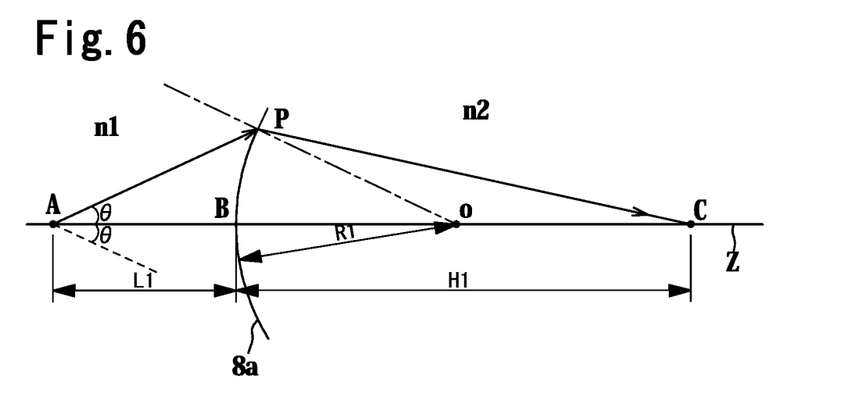
FIG. 6 is a diagram illustrating a radius of curvature R1 of a first convex lens portion.

The setting of the radius of curvature R1 of the first convex lens portion 8 will be described based on FIG. 6.

An arc 8a having a radius R1 about the point O represents a partial spherical surface of the first convex lens portion 8 having a radius of curvature R1, and light having a divergence angle 20 is emitted along the optical axis Z from a point A at a distance L1 from the arc 8a. A point at which the optical axis Z intersects the arc 8a is a point B, a point at which the outermost ray of the incident light intersects the arc 8a is a point P, and a point on the optical axis Z at which the incident light is focused is a point C. The distance from B to point C is H1. The incident light is emitted in the air, and the refractive index of the air is n1, the refractive index of the first convex lens portion 8 is n2, and the refractive index n2 of the first convex lens portion 8 with respect to the refractive index n of the air is n (i.e. n=n2/n1). At this time, the relationship between the radius of curvature R1, the distances L1, H1, and the refractive index n is expressed by the following equation (1) by paraxial ray approximation.

$$(1/L1)+(n/H1)=(n-1)/R1 \tag{1}$$

When the light absorbing portion 13 is provided at the point C, if a radius of curvature larger than the radius of curvature R1 obtained by giving the refractive index n and the distances L1 and H1 to the equation (1) is set, since the light condensing function is weakened, the light can be condensed so that the incident light does not focus on the light absorbing portion 13 at the point C. Therefore, the radius of curvature R1 is set so as to satisfy the following equation (2) obtained by modifying the equation (1).

$$R1>(n-1)/((L1+n/H1) \tag{2}$$

Similarly, when the light absorbing portion 13 is provided at the point C, the incident light is regarded as a bundle of light rays parallel to the optical axis Z, and the distance L1→∞ in the equation (1), and the refractive index n and the distance H1 are given to obtain the radius of curvature R1. By setting a radius of curvature smaller than the radius of curvature R1 obtained in this way, the light condensing action of the first convex lens portion 8 is enhanced, so that incident light having a divergence angle can be collected on the light absorbing portion 13. Therefore, the radius of curvature R1 is set so as to satisfy the following equation (3) obtained by modifying the equation (1).

$$R1<(n-1)/(n/H1) \tag{3}$$

Figure 7:
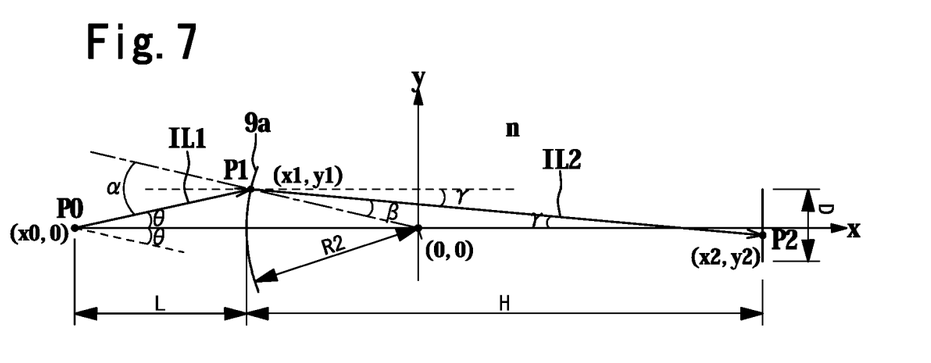
FIG. 7 is a diagram illustrating a radius of curvature R2 of a second convex lens portion.

Next, the setting of the radius of curvature R2 of the second convex lens portion 9 will be described based on FIG. 7.

An arc 9*a* having a radius R2 represents a partial spherical surface of the second convex lens portion 9 having a radius of curvature R2, and light having a divergence angle 20 is emitted at a point P0 at a distance L from the arc 9*a* on the optical axis Z of the second convex lens portion 9 along the optical axis Z.

The optical axis Z is the x-axis, the y-axis orthogonal to the x-axis is set with the center of the arc 9*a* as the origin, and the point P1 is defined as the point where the outermost ray IL1 of the incident light enters the second convex lens portion 9 at the incident angle α. And the refraction angle at the point P1 is β. If the refractive index n2 of the second convex lens portion 9 with respect to the refractive index n1 of air is the refractive index n, the refractive index n=sin α/sin β according to Snell's law. A straight line having a length D that represents the light absorbing portion 13 having a diameter D perpendicular to the x-axis and centered on a point (x2, 0) on the x-axis at a distance H in the traveling direction of the incident light from the second convex lens portion 9 is set. Then, the point at which the light beam IL2 refracting at the refraction angle β at the point P1 intersects the x-axis (optical axis Z) and then intersects with the straight line representing the light absorbing portion 13 is referred to as point P2. The intersection angle between the ray IL2 and the x-axis is γ.

Assuming that the coordinates of the points P0, P1, and P2 are P0 (x0, 0), P1 (x1, y1), and P2 (x2, y2), based on a straight line y=(x−x0)·tan θ representing the light beam IL1 and a straight line (y−y1)=(x−x1)·tan γ representing a light beam IL2, these relationships are expressed as the following equations (4) to (1).

(Equations)

$$x0 = -(L+R2) \quad (4)$$

$$x1 = [x0 \cdot \tan^2\theta - (R2^2(1+\tan^2\theta) - x0^2 \cdot \tan^2\theta)^{1/2}]/(1+\tan^2\theta) \quad (5)$$

$$y1 = -\tan\theta \cdot [x0 + (R2^2(1+\tan^2\theta) - x0^2 \cdot \tan^2\theta)^{1/2}]/(1+\tan^2\theta) \quad (6)$$

$$x2 = H - R2 \quad (7)$$

$$y2 = y1 + (x2 - x1) \cdot \tan\gamma \quad (8)$$

$$\alpha = \pi/2 + \theta - \cos^{-1}(y1/R2) \quad (9)$$

$$B = \sin^{-1}(\sin\alpha/n) \quad (10)$$

$$\gamma = \alpha - \beta - \theta \quad (11)$$

By means of applying, the distance L from the emission point of the incident light to the second convex lens portion 9, the divergence angle θ (half angle) of the incident light, and the diameter D of the light absorbing portion 13, the distance H between the second convex lens portion 9 and the light absorbing portion 13 to above equations (4) to (1), the radius of curvature R2 of the second convex lens portion 9 is set such that |y2|=D/2 at the point P2 where the light beam IL2 crosses the optical axis Z and then enters the light absorbing portion 13. For example, when L=50 μm, 2θ=5° (θ=2.5°), D=20 μm, and H=150 μm, then R2 is set to 20 μm. The second convex lens portion 9 having the radius of curvature R2 set in this way makes the incident light reach the light absorbing portion 13 so as to spread, so that the concentration of the incident light in the light absorbing portion 13 is reduced. Therefore, the space charge effect due to the concentration of the electric charge generated in the light absorbing portion 13 can be suppressed by the second convex lens section 9, so that the response speed can be increased.

Here, the distance L1 between the emission point of the incident light and the first convex lens portion 8 is substantially equal to the distance L between the emission point of the incident light and the second convex lens portion 9. The distance H1 between the first convex lens portion 8 and the light absorbing portion 13 is substantially equal to the distance H between the second convex lens portion 9 and the light absorbing portion 13. Therefore, the radius of curvature R1 of the first convex lens portion 8 may be set by applying L and H respectively in stead of L1 and H1 of the equations (2) and (3). That is, by setting the radius of curvature R1 so as to satisfy the following equation (12), it is possible to collect light on the light absorbing portion 13 so that the first convex lens portion 8 does not focus on the light absorbing portion 13. For example, when L=50 μm, H=150 μm, and n=3.2, then R1 is set to 100 μm.

$$(n-1)/((L+n/H) < R1 < (n-1)/(n/H) \quad (12)$$

Next, a method for manufacturing the semiconductor light receiving element 1 will be described.

Figure 8:
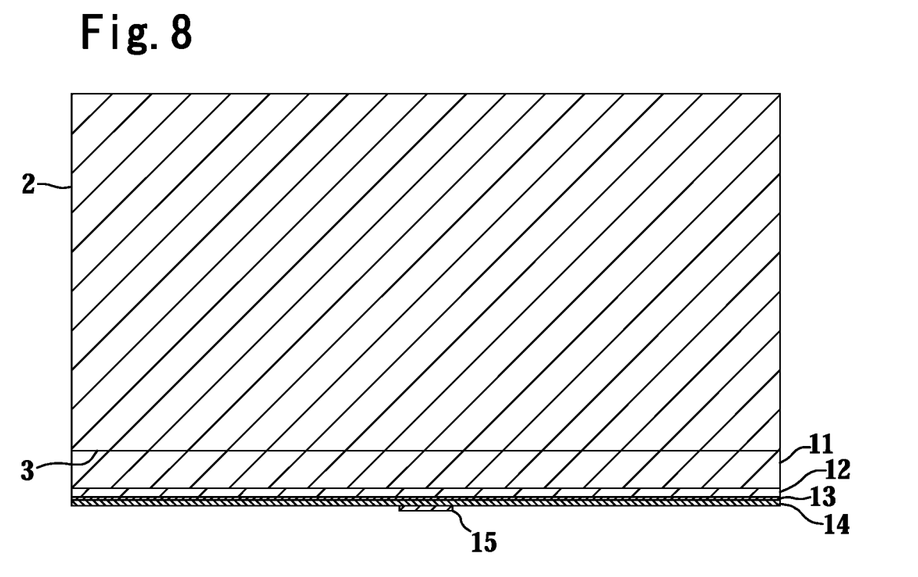
FIG. 8 is a cross-sectional view showing a step of manufacturing a semiconductor layers of the semiconductor light receiving element.

As shown in FIG. 8, a buffer layer 11, a first semiconductor layer 12, a light absorbing portion 13, and a second semiconductor layer 14 are sequentially formed on a main surface 3 of a clean semiconductor substrate 2 from the main surface 3 side by a vapor phase growth method or the like. Then, an etching mask 15 (not shown) is formed on the surface of the second semiconductor layer 14 so as to cover a predetermined region where the light receiving part 4 is formed. The etching mask 15 is formed by removing, for example, a silicon nitride film formed on the surface of the second semiconductor layer 14 so as to remain only in a predetermined region by a selective etching method or the like.

Figure 9:
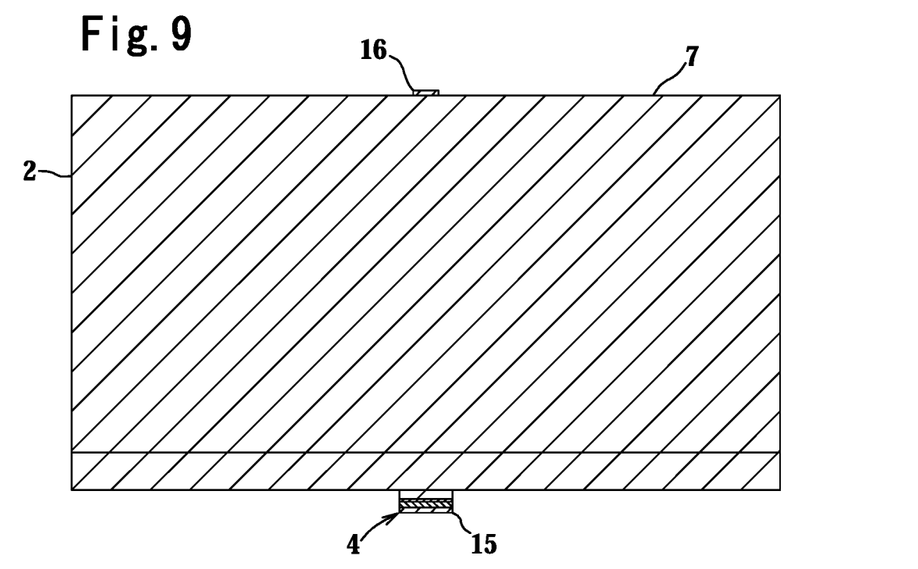
FIG. 9 is a cross-sectional view illustrating a step of manufacturing a light receiving part of the semiconductor light receiving element.

Next, as shown in FIG. 9, the second semiconductor layer 14, the light absorbing portion 13, and the first semiconductor layer 12 are selectively etched so that the buffer layer 11 is exposed while leaving a predetermined portion covered with the etching mask 15, thereby forming the light receiving part 4 having the light absorbing portion 13 having a diameter D of, for example, 20 μm, and then the etching mask 15 is removed. In the case of chemical etching, an etching solution usually used is a mixture of hydrogen bromide (HBr) and methanol, but is not limited to this, and a known etching solution can be used. The light receiving part 4 may be formed by dry etching.

After removing the etching mask 15, the main surface of the semiconductor substrate 2 having the light receiving part 4 is covered with a protective film (not shown) made of, for example, a photoresist in order to protect the main surface 3. Then, an etching mask 16 is formed on the back surface 7 of the semiconductor substrate 2 so as to cover a predetermined region having a diameter of, for example, 20 μm for forming the second convex lens portion 9. The etching mask 16 is formed by removing, for example, a silicon nitride film formed on the back surface 7 of the semiconductor substrate 2 so as to remain only in a predetermined region by a selective etching method or the like.

Figure 10:
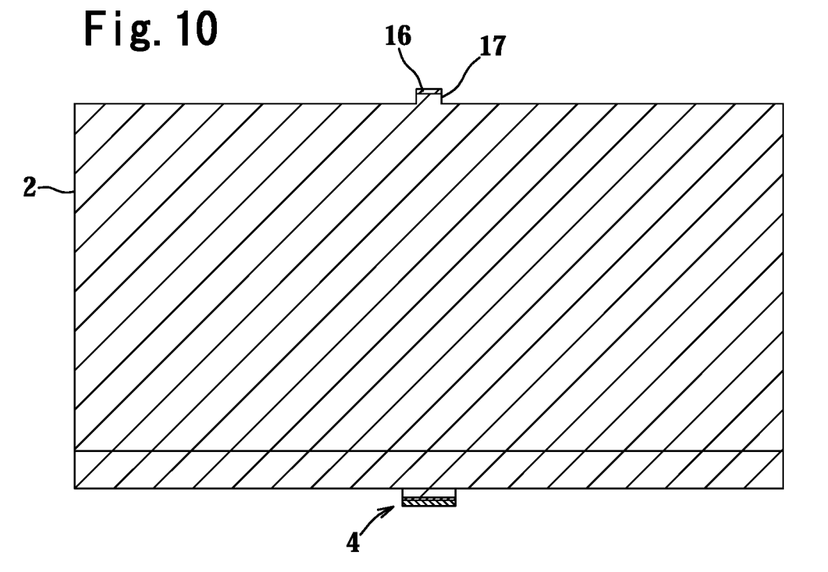
FIG. 10 is a cross-sectional view illustrating a step of manufacturing a convex portion serving as a second convex lens portion of the semiconductor light receiving element.

Next, as shown in FIG. 10, a substantially cylindrical region 17 for forming the second convex lens portion 9 is formed on the back surface 7 side of the semiconductor substrate 2 by a selective etching method so as to protrude from the semiconductor substrate 2, and then the mask 16 is removed. At this time, the above-mentioned etching solution can be used, and the region 17 can be formed by dry etching.

Figure 11:
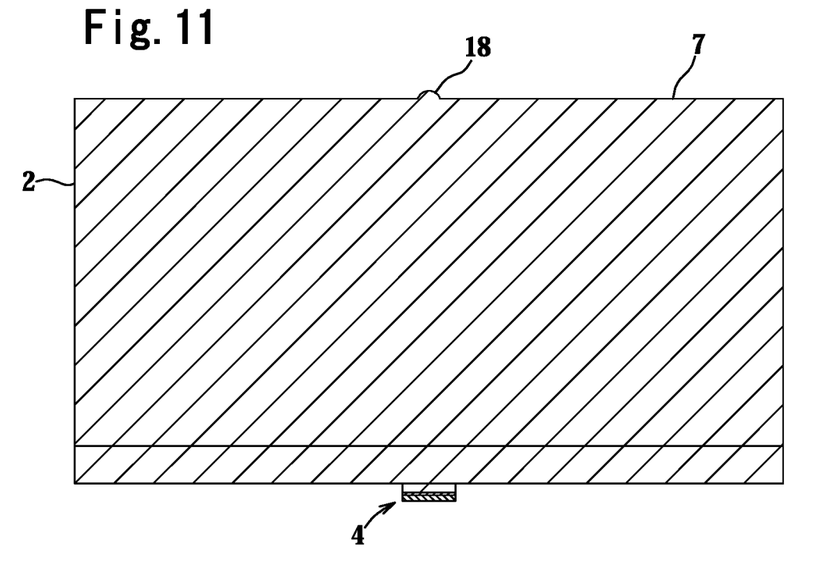
FIG. 11 is a cross-sectional view illustrating a step of manufacturing a second convex lens portion of the semiconductor light receiving element.

Next, as shown in FIG. 11, the entire back surface 7 of the semiconductor substrate 2 is etched with the above-described etching solution to form a partially spherical projection 18. At this time, since the etching of the corners of the substantially cylindrical region 17 serving as the second convex lens portion 9 proceeds from two surfaces forming the corners (the circular plane and the circumferential surface of the cylinder), In comparison with flat portion, the etching is promoted and the film becomes round. Utilizing the fact that the corners of the region 17 become rounded, the partially spherical convex portion 18 is formed, and the radius of curvature of the convex portion 18 is larger than the radius of curvature R2.

Figure 12:
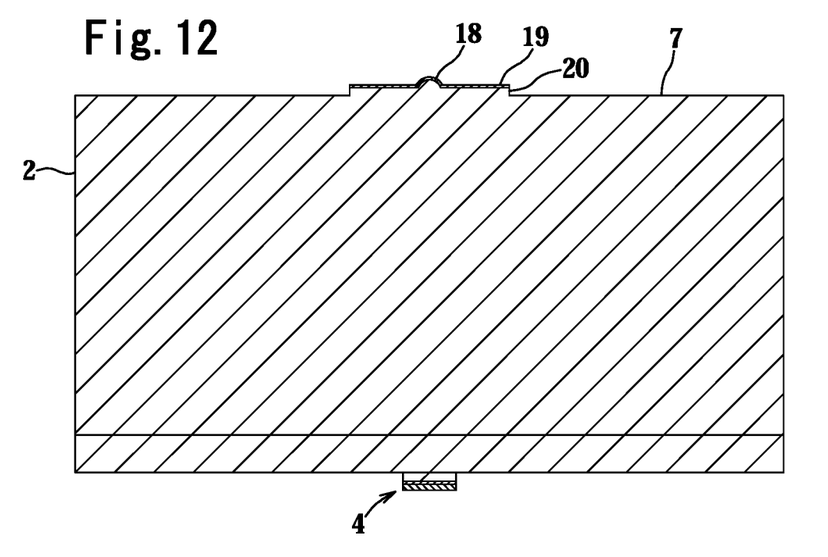
FIG. 12 is a cross-sectional view illustrating a step of manufacturing a convex portion serving as a first convex lens portion of the semiconductor light receiving element.

Next, as shown in FIG. 12, an etching mask 19 is formed to cover a predetermined region having a diameter of, for example, 80 μm for forming the first convex lens portion 8 including the convex portion 18. Then, after forming a substantially cylindrical region 20 for forming the first convex lens portion 8 including the convex portion 18 on the back surface 7 side of the semiconductor substrate 2 by selective etching so as to protrude from the semiconductor substrate 2, and then the etching mask 19 is removed. The etching mask 19 is formed by removing, for example, a silicon nitride film formed on the back surface 7 of the semiconductor substrate 2 so as to remain only in a predetermined region by a selective etching method. The above-mentioned etching solution can be used when forming the region 20, and it can be formed by dry etching.

Figure 13:
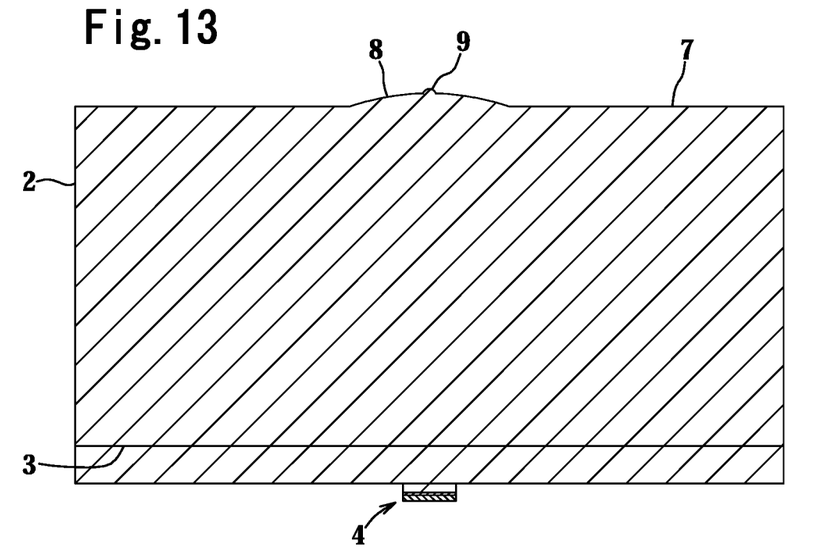
FIG. 13 is a cross-sectional view showing a step of manufacturing a first convex lens portion of the semiconductor light receiving element.

Next, as shown in FIG. 13, the entire back surface 7 of the semiconductor substrate 2 is etched with the above-mentioned etching solution to form the partially convex first convex lens portion 8 and the second convex lens portion 9 which is formed by etching the partially spherical convex portion 18. At this time, the partially convex first convex lens portion 8 having the set radius of curvature R1 is formed by utilizing the fact that the etching of the corner portion of the substantially cylindrical region 20 is promoted and rounded as compared with the flat portion. The second convex lens portion 9 having a partial radius of curvature R2 is formed by utilizing the fact that the etching of the partial spherical surface of the convex portion 18 proceeds substantially uniformly.

Although not shown, an anti-reflection film 10 made of a silicon nitride film or the like is formed by a plasma CVD method so as to cover at least the first and second convex lens portions 8 and 9, and is shown on the main surface 3 side of the semiconductor substrate 2. After removing the outer protective film and selectively forming the p-electrode 5 and the n-electrode 6 with a laminated metal film having, for example, a chromium film, a nickel film as an adhesion layer, dicing is performed to a predetermined size to obtain respective semiconductor light receiving element 1.

The operation and effect of the semiconductor light receiving element 1 according to the embodiment will be described.

As shown in FIG. 2, the semiconductor light receiving element 1 is capable of condensing the light incident on the first convex lens portion 8 on the light absorbing portion 13, and the light incident on the second convex lens portion 9 is focused in front of the light absorbing portion 13, and the light is diffused from the focal point toward the light absorbing portion 13. Therefore, the amount of light received by the light absorbing portion 13 can be secured, and the space charge effect can be avoided by suppressing the excessive concentration of the charges generated in the light absorbing portion 13, and the response speed of the semiconductor light receiving element 1 can be increased.

In addition, by means of applying the distance L from the emission point of the incident light to the second convex lens portion 9, the divergence angle θ (half angle) of the incident light, the diameter D of the light absorbing portion 13, and the distance H between the second convex lens portion 9 and the light absorbing portion 13 to above equations (4) to (11), the radius of curvature R2 of the second convex lens portion 9 can be set to spread all of the light incident on the second convex lens portion 9 to the light absorbing portion 13 and to surely make the light incident on the second convex lens portion 9 enter the light absorbing portion 13. Therefore, the light receiving amount can be ensured, and the space charge effect can be avoided, so that the response speed of the semiconductor light receiving element 1 can be increased.

In addition, based on the distance H between the second convex lens portion 9 and the light absorbing portion 13 which is substantially equal to the distance H1 between the first convex lens portion 8 and the light absorbing portion 13 and the refractive index n of the semiconductor substrate 2 with respect to air, the curvature radius R1 of the first convex lens portion 8 is set so as to satisfy the equation (12). Therefore, the incident light that has not entered the second convex lens portion 9 can be collected by the first convex lens portion 8 so that the light is not focused on the light absorbing portion 13, and the amount of received light can be secured. Further, since the semiconductor substrate 2 is made of an InP substrate, the response speed of the semiconductor light receiving element 1 for optical communication can be increased.

The divergence angle and the length of each part are merely examples, and are not limited thereto, and may be appropriately set according to required performance. In addition, those skilled in the art can implement the present invention in a form in which various modifications are added to the above-described embodiment without departing from the spirit of the present invention, and the present invention includes such modified forms.

DESCRIPTION OF REFERENCE NUMERALS

1: Semiconductor photo detector
2: Semiconductor substrate
3: Main surface
4: Light receiving part
5: p-electrode
6: n-electrode
7: Back side
8: First convex lens portion
9: Second convex lens portion
10: Anti-reflection coating
13: Light absorbing portion

The invention claimed is:

1. A semiconductor light receiving element of back-illuminated type comprising a light absorbing portion provided in a vicinity of a main surface of a semiconductor substrate transparent to an incident light, and a first convex lens portion having a larger diameter than the light absorbing portion and having a radius of curvature R1 provided on a back surface of the semiconductor substrate opposite to the main surface, in which a center of the light absorbing portion is located on an optical axis of the first convex lens portion; wherein in a central portion of the first convex lens portion, provided is a second convex lens portion having a common optical axis to the first convex lens portion, a smaller diameter than the light absorbing portion, and a curvature radius R2 smaller than the curvature radius R1, the second convex lens portion has a focal point between the second convex lens portion and the light absorbing portion, thereby diffusing light incident on the second convex lens portion from the focal point toward the light absorbing portion, based on a distance L from an emission point of the incident light to the second convex lens portion, a divergence angle θ of the incident light, a diameter D of the light absorbing portion, and a distance H between the second convex lens portion and the light absorbing portion, the radius of curvature R2 of the second convex lens portion is set such that all of the incident light incident on the second convex lens portion is incident on the light absorbing portion, and when a refractive index of the semiconductor substrate with respect to air is n, then the radius of curvature R1 of the first convex lens portion satisfies a relation of $(n-1)/(1/L+n/H) < R1 < (n-1)/(n/H)$.

2. The semiconductor light receiving element according to claim 1, wherein the semiconductor substrate is made of an InP substrate.

3. A semiconductor light receiving element of back-illuminated type comprising a light absorbing portion provided in a vicinity of a main surface of a semiconductor substrate transparent to an incident light, and a first convex lens portion having a larger diameter than the light absorbing portion and having a radius of curvature R1 provided on a back surface of the semiconductor substrate opposite to the main surface, in which a center of the light absorbing portion is located on an optical axis of the first convex lens portion; wherein formed directly on a central portion of a convex surface of the first convex lens portion is a second convex lens portion having a common optical axis to the first convex lens portion, a smaller diameter than the light absorbing portion, and a curvature radius R2 smaller than the curvature radius R1, the radius of curvature R2 of the second convex lens portion is set such that all of the incident light incident on the second convex lens portion is incident on the light absorbing portion, and the second convex lens portion has a focal point spaced from the first convex lens portion and situated between the second convex lens portion and the light absorbing portion, thereby diffusing light incident on the second convex lens portion from the focal point toward the light absorbing portion.

4. The semiconductor light receiving element according to claim 3, wherein the semiconductor substrate is made of an InP substrate.

* * * * *